United States Patent
Muramatsu et al.

(10) Patent No.: US 8,575,495 B2
(45) Date of Patent: Nov. 5, 2013

(54) WIRING SUBSTRATE, SEMICONDUCTOR DEVICE, AND METHOD FOR MANUFACTURING WIRING SUBSTRATE

(75) Inventors: Shigetsugu Muramatsu, Nagano (JP); Satoshi Sunohara, Nagano (JP)

(73) Assignee: Shinko Electric Industries Co., Ltd. (JP)

(*) Notice: Subject to any disclaimer, the term of this patent is extended or adjusted under 35 U.S.C. 154(b) by 197 days.

(21) Appl. No.: 13/239,630

(22) Filed: Sep. 22, 2011

(65) Prior Publication Data
US 2012/0073862 A1    Mar. 29, 2012

(30) Foreign Application Priority Data
Sep. 28, 2010 (JP) .................. 2010-216614

(51) Int. Cl.
*H05K 1/16* (2006.01)
*H05K 1/02* (2006.01)

(52) U.S. Cl.
CPC .................... *H05K 1/0269* (2013.01)
USPC ........................ 174/260; 361/760

(58) Field of Classification Search
CPC .................................................. H05K 1/0269
USPC .......... 174/260, 251, 250; 361/760, 793, 761; 29/832, 847
See application file for complete search history.

(56) References Cited

U.S. PATENT DOCUMENTS

| | | | |
|---|---|---|---|
| 6,215,195 B1 * | 4/2001 | Koduri | 257/784 |
| 6,400,037 B1 * | 6/2002 | Omizo | 257/797 |
| 6,897,010 B2 * | 5/2005 | Hirooka | 430/323 |
| 7,483,277 B2 * | 1/2009 | Sakai | 361/761 |
| 7,674,987 B2 * | 3/2010 | Kodama et al. | 174/260 |
| 8,037,596 B2 | 10/2011 | Muramatsu et al. | |
| 8,222,532 B2 | 7/2012 | Muramatsu et al. | |
| 2003/0214794 A1 * | 11/2003 | Takahashi et al. | 361/761 |
| 2006/0027809 A1 * | 2/2006 | Ogawa et al. | 257/66 |
| 2008/0251279 A1 | 10/2008 | Muramatsu et al. | |
| 2010/0296257 A1 * | 11/2010 | Yang et al. | 361/749 |
| 2011/0253422 A1 | 10/2011 | Muramatsu et al. | |
| 2011/0304995 A1 * | 12/2011 | Nakanishi et al. | 361/749 |

FOREIGN PATENT DOCUMENTS

| | | |
|---|---|---|
| JP | 05-267802 | 10/1993 |
| JP | 2000-200955 | 7/2000 |
| JP | 2008-140886 | 6/2008 |
| JP | 2008-227309 | 9/2008 |
| JP | 2009-088011 | 4/2009 |

* cited by examiner

*Primary Examiner* — Yuriy Semenenko
(74) *Attorney, Agent, or Firm* — Fish & Richardson P.C.

(57) ABSTRACT

A wiring substrate includes a wiring pattern, which includes an upper surface forming a desired recognition mark, and a solder resist layer, which covers the wiring pattern. The solder resist layer includes a recess that entirely exposes the upper surface of the wiring pattern. The solder resist layer includes a solder resist layer formed at a region corresponding to the recess and a solder resist layer formed outside the recess. The recess entirely exposes the upper surface of the wiring pattern as the recognition mark, and the solder resist layer is formed at portions outside the upper surface of the wiring pattern.

13 Claims, 12 Drawing Sheets

WIRING SUBSTRATE, SEMICONDUCTOR DEVICE, AND METHOD FOR MANUFACTURING WIRING SUBSTRATE

CROSS-REFERENCE TO RELATED APPLICATIONS

This application is based upon and claims the benefit of priority from prior Japanese Patent Application No. 2010-216614, filed on Sep. 28, 2010, the entire contents of which are incorporated herein by reference.

BACKGROUND OF THE INVENTION

The present invention relates to a wiring substrate, a semiconductor device, and a method for manufacturing a wiring substrate.

When mounting a component such as a semiconductor chip on a wiring substrate, an insulation material referred to as a solder resist protects the outermost layer of the wiring substrate from the adhesion or contamination of solder and the like. In this case, to form a pad that is required to couple the mounted component, the insulation material (solder resist) includes an opening, which exposes a wiring layer that is formed under the solder resist. The opening is formed by performing photolithography, screen printing, laser processing, or the like.

When performing photolithography, referring to FIG. 12(a), the necessary number of lower layer wires 14 and 15 are first formed on a core substrate 11. The lower layer wires 14 and 15 are respectively covered by insulation layers 12 and 13. Then, a wiring layer 80, which serves as an uppermost layer, and an insulation layer 81 (solder resist layer), which covers the wiring layer 80, are formed. Subsequently, photolithography is performed to expose and develop the insulation layer 81. This forms a predetermined pattern of openings 81a as shown in FIG. 12(b) and exposes parts of the wiring layer 80, which is the uppermost layer, as pads 80a.

When performing screen printing, a printing mask is used to print insulation material (solder resist) in only the necessary portions. When performing laser processing, an insulation material (solder resist) is applied entirely to a surface. Then, a laser beam is emitted against regions that are to be exposed (regions corresponding to openings) in order to remove the insulation material.

As described above, in photolithography, photosensitive resin is used as the solder resist, and the solder resist is exposed and developed to form a pattern. However, the heat resistance and chemical resistance of a photosensitive resin are usually low. In screen printing and layer printing, non-photosensitive resin such as thermosetting resin that has a higher reliability than photosensitive resin can be used as the solder resist. However, the formation of fine patterns is difficult, and the manufacturing cost is high.

Blasting has also been proposed as another method for forming openings that expose pads. For example, when performing sandblasting, referring to FIG. 13(a), the necessary number of lower layer wires 14 and 15 are first formed on a core substrate 11. The lower layer wires 14 and 15 are respectively covered by insulation layers 12 and 13. Then, a wiring layer 90, which serves as an uppermost layer, and an insulation layer 91 (solder resist layer), which covers the wiring layer 90, are formed. Subsequently, as shown in FIG. 13(b), a dry film resist (DFR) 92, which is used for protection from sandblasting, is applied to the insulation layer 91. The DFR 92 is exposed and developed to form a predetermined pattern of openings 92a. Then, referring to FIG. 13(c), abrasive grains are blasted against the openings 92a of the DFR 92 to form openings 91a in the insulation layer 91 and expose parts of the wiring layer 90, which is the uppermost layer, as pads 90a or recognition marks 90b. Referring to FIG. 13(d), the DFR 92 is then removed.

Japanese Laid-Open Patent Publication Nos. 05-267802 and 2008-227309 disclose the prior art described above.

SUMMARY OF THE INVENTION

When blasting an insulation layer (solder resist layer) to form an opening, as shown in FIG. 14, an opening 91a in the insulation layer 91 may be T-shaped or triangular and include a right-angled or acute-angled corner. In such a case, it becomes difficult for the blasted abrasive grains blasted against the insulation layer 91 to enter a right-angled or acute-angled corner. This rounds the portion at which the right-angled or acute-angled corner are to be formed as shown in FIGS. 15(a) and 15(b). Thus, when blasting the insulation layer 91 to form an opening 91a and obtain a recognition mark 90b (alignment mark used for component mounting, exposure, and the like, character or numeral required for management), the edges of the recognition mark 90b are rounded. This lowers the discernibility of the recognition mark 90b.

One aspect of the present invention is a wiring substrate including a substrate body and an uppermost layer wiring, which is formed on the substrate body and includes a first wiring layer. The first wiring layer includes an upper surface, which forms a desired recognition mark, and a side wall, which is adjacent to the upper surface. An insulation layer is formed on the substrate body and the uppermost layer wiring. The insulation layer includes a recess, which entirely exposes the upper surface of the first wiring layer, and a side wall, which is adjacent to the side wall of the first wiring layer.

A further aspect of the present invention is a method for manufacturing a wiring substrate. The method includes preparing a substrate body, forming uppermost layer wiring, which includes a first wiring layer including an upper surface that forms a desired recognition mark, on the substrate body, forming an insulation layer on the substrate body and the first wiring layer, and forming a recess that entirely exposes the upper surface of the first wiring layer, which forms the recognition mark, from the insulation layer by partially reducing thickness of the insulation layer at a region that corresponds to and is larger than the upper surface of the first wiring layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE INVENTION

Figure 1:
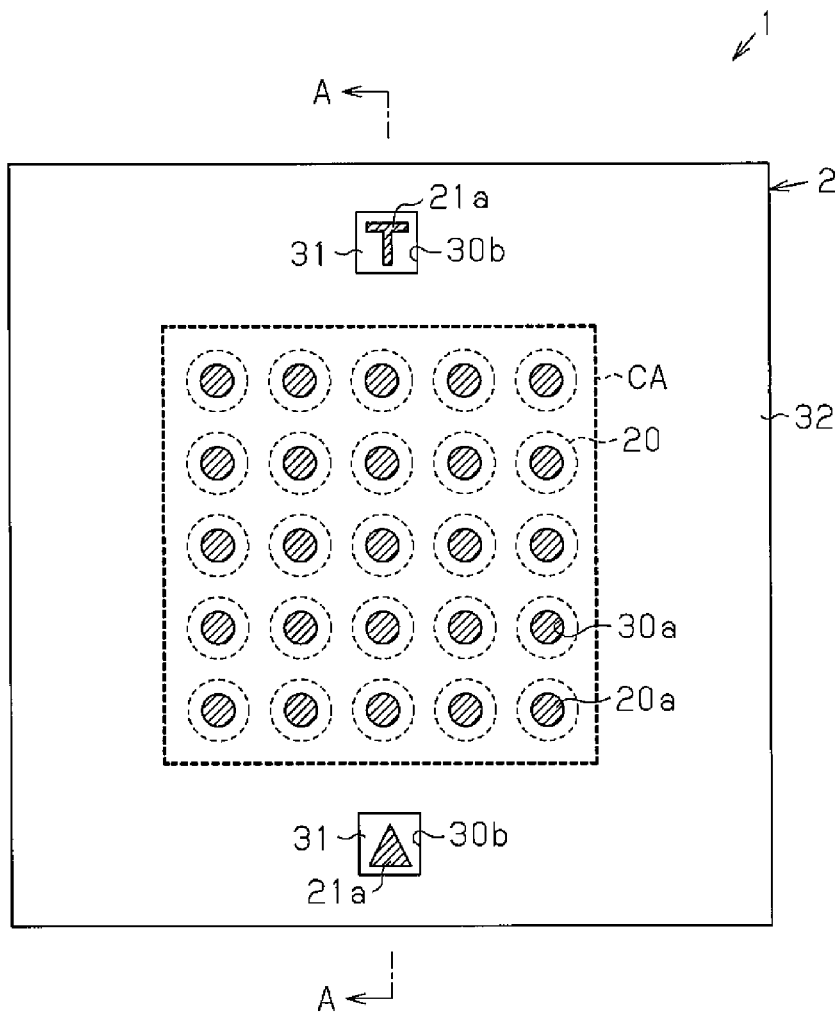
FIG. 1(a) is a schematic plan view showing a first embodiment of a semiconductor device.
FIG. 1(b) is a schematic cross-sectional view showing the semiconductor device of FIG. 1(a)
Figure 1:
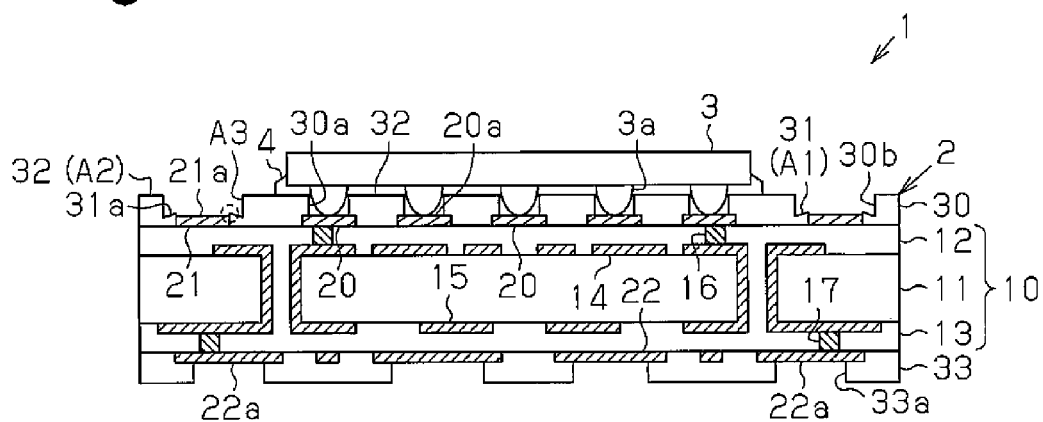

Embodiments of the present invention will now be described with reference to the accompanying drawings. The purpose of the drawings is to schematically illustrate structures, which are not in scale with actual size.

First Embodiment

A first embodiment of a semiconductor device 1 will now be described with reference to FIGS. 1 to 6. In the present invention, like or same reference numerals are given to those components that are the same as the corresponding components illustrated in FIGS. 12 to 15.

Figure 2:
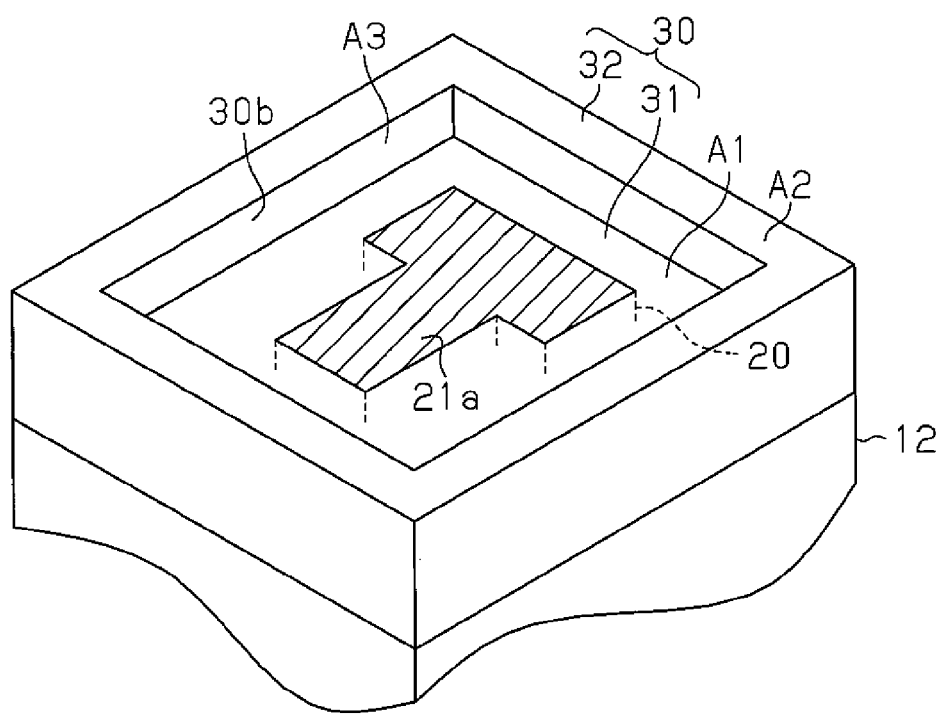
FIG. 2 is a schematic perspective view showing the semiconductor device of FIG. 1(a)

FIG. 1(a) is a schematic plan view showing the semiconductor device 1 of the present embodiment, and FIG. 1(b) is a schematic cross-sectional view showing the semiconductor device taken along line A-A in FIG. 1(a). FIG. 2 is a schematic perspective view showing part of the semiconductor device 1.

Referring to FIGS. 1(a) and 1(b), the semiconductor device 1 of the present embodiment includes a wiring substrate 2, a semiconductor chip 3, and an underfill resin 4.

As shown in FIG. 1(b), the wiring substrate 2 includes a substrate body 10, uppermost layer wiring patterns 20 and 21 (uppermost layer wiring), a lowermost layer wiring pattern 22, and solder resist layers 30 and 33. The semiconductor chip 3 mounted on the wiring substrate 2 includes a circuit formation surface (lower surface as viewed in FIG. 1(b)). A plurality of bumps 3a are arranged in a matrix on the circuit formation surface.

The substrate body 10 includes a core substrate 11, insulation layers 12 and 13, wires 14 and 15 and vias 16 and 17 respectively formed in the insulation layers 12 and 13. The wires 14 and 15 and the vias 16 and 17 arranged on the substrate body 10 electrically couple the wiring patterns 20 and 22. The wires 14 and 15 and the vias 16 and 17 may be formed from, for example, copper (Cu). Further, the insulation layers 12 and 13 may be formed from an insulation resin of, for example, epoxy resin or polyimide resin.

The wiring pattern 20 is arranged on the chip mounting side (upper side as viewed in FIG. 1(b)) of the substrate body 10. The wiring pattern 20 includes pads 20a, which are coupled to the bumps 3a of the semiconductor chip 3. The pads 20a are formed by circular portions of the wiring pattern 20 (refer to FIG. 1(a)).

The wiring pattern 21 is arranged on the chip mounting side of the substrate body 10. An upper surface of the wiring pattern 21 is entirely exposed from the solder resist layer 30 to form recognition marks 21a. Further, the wiring pattern 21 (recognition marks 21a) includes upper surfaces that are formed to be, for example, triangular or T-shaped. The wiring pattern 21 has the same thickness as the wiring pattern 20. The wiring patterns 20 and 21 may be formed from, for example, copper. The wiring patterns 20 and 21 may be formed by applying a plating (e.g., nickel plating or gold plating) to the surface of a copper layer.

As shown in FIG. 1(b), the wiring pattern 22 is arranged on the substrate body 10 on the opposite side (lower side as viewed in FIG. 1(b)) of the chip mounting surface. The wiring pattern 22 includes external coupling pads 22a, which are used by external coupling terminals coupled to a mounted substrate such as a mother board. The wiring pattern 22 may be formed from, for example, copper.

The solder resist layer 30 is arranged on a chip mounting surface of the substrate body 10 to cover the wiring patterns 20 and 21. The solder resist layer 30 may be formed from, for example, an epoxy insulation resin. The solder resist layer 30 includes a plurality of openings 30a, which expose parts of the wiring pattern 20, and recesses 30b, which entirely expose an upper surface of the wiring pattern 21. The solder resist layer 30 includes solder resist layers 31, which are formed in regions corresponding to the recesses 30b, and a solder resist layer 32, which is formed outside the regions corresponding to the recesses 30b. In other words, as shown in FIGS. 1 and 2, the solder resist layer 30 includes the solder resist layers 31, which form bottom surfaces A1 of the recesses 30b, and the solder resist layer 32, which form a surrounding portion A2 of the recesses 30b. The solder resist layer 31 is formed integrally with the solder resist layer 32.

The shape of each opening 30a will now be described with reference to FIG. 1. In the present embodiment, the bumps 3a of the semiconductor chip 3 are arranged in a matrix. Thus, the pads 20a are also arranged in a matrix on a chip mounting region CA of the wiring substrate 2 in correspondence with the layout of the bumps 3a (refer to FIG. 1(a)). Further, the openings 30a are arranged in a matrix in the chip mounting region CA. In the same manner as the pads 20a of the wiring pattern 20, the openings 30a are circular. In addition, the openings 30a are smaller than the corresponding portions of the wiring pattern 20. Thus, the corresponding portions of the wiring pattern 20 are partially exposed as the pads from the solder resist layer 30.

The shape of each recess 30b will now be described. In the present embodiment, the wiring pattern 21 under the solder resist layer 30 forms each recognition mark 21a with a desired shape. When it is desirable that the recognition mark 21a be T-shaped, the corresponding part of the wiring pattern 21 is formed to be T-shaped. When it is desirable that the recognition mark 21a be triangular, the corresponding part of the wiring pattern 21 is formed to be triangular. As shown in FIGS. 1 and 2, each recess 30b has a bottom surface that is larger than the corresponding part of the wiring pattern 21. Thus, the upper surface of the wiring pattern 21 is entirely exposed. More specifically, the bottom surface of the recess 30b is tetragonal and formed to have a larger area than the corresponding part of the wiring pattern 21.

In the recess 30b that has such a shape, the upper surface of the wiring pattern 21 is entirely exposed to form each recognition mark 21a, and the parts outside the recognition mark 21a forms the solder resist layer 31. Thus, the shape of the wiring pattern 21 when viewed from above is the shape of the recognition mark 21a. Even when the desired shape of the recognition mark 21a includes a right-angled or acute-angled corner when viewed from above, the wiring pattern 21 can easily be formed with the desired shape through photolithography. Accordingly, by entirely exposing the upper surface of the wiring pattern 21, the recognition mark 21a may be formed with the desired shape even when the recesses 30b cannot be formed with the desired shape through a blasting process.

In the recess 30b, the solder resist layer 31 (solder resist layer 30) is formed in contact with side walls of the wiring pattern 21. In other words, the recognition mark 21a is surrounded by the solder resist layer 31 (solder resist layer 30). The solder resist layer 31 has an upper surface (bottom surface A1 of the recess 30b) that includes a curved portion 31a, which is curved in a concaved manner from the edge of the recognition mark 21a to a side wall A3 of the recess 30b. Thus, the solder resist layer 31 includes a lower side wall, which surrounds the recognition mark 21a, and an upper side wall, which is the side wall A3. The curved portion 31a improves the discernibility of the recognition mark 21a. For example, light is emitted with a fixed intensity toward the recognition mark 21a and the solder resist layer 31 and reflected. The recognition mark 21a is detected in accordance with the intensity of the reflected light received by a light receiver. In this case, the recognition mark 21a efficiently reflects light in a specific direction (toward the light receiver). This increases the intensity of the reflection light at the light receiver. In contrast, the curved portion 31a does not reflect light in a specific direction. This decreases the intensity of the reflection light at the light receiver, increases the difference between the reflection light intensity of the recognition mark 21a and the reflection light intensity of the solder resist layer 31, and emphasizes the boundary between the recognition mark 21a and the solder resist layer 31 (refer to the portion encircled by broken lines in FIG. 1(b)). As a result, recognition of the profile (shape) of the recognition mark 21a is facilitated, and the discernibility of the recognition mark 21a is improved.

The relationship between the recess 30b and the recognition mark 21a will now be described in further detail. The bottom surface A1 of the recess 30b (upper surface of the solder resist layer 31) is located at a level that is higher than that of the recognition mark 21a and lower than that of the surrounding portion A2 of the recess 30b (upper surface of the solder resist layer 32). Further, the bottom surface A1 of the recess 30b (upper surface of the solder resist layer 31) has a surface roughness that is greater than that of the upper surface of the recognition mark 21a and that of the surrounding portion A2 of the recess 30b (upper surface of the solder resist layer 32). The difference in surface roughness between the solder resist layer 31 and the recognition mark 21a also improves the discernibility of the recognition mark 21a.

When a portion having a high surface roughness is irradiated with light, the reflection is diffused. This decreases the intensity of the reflection light. Thus, the difference in the surface roughness increases the difference between the reflection light intensity of the recognition mark 21a and the reflection light intensity of the solder resist layer 31. This facilitates recognition of the profile (shape) of the recognition mark 21a and improves the discernibility of the recognition mark 21a.

Referring to FIG. 1(b), each external coupling pad 22a is formed by exposing part of the wiring pattern 22 from an opening 33a of the solder resist layer 33, which is formed under the substrate body 10.

The semiconductor chip 3 is flip-chip-bonded to the wiring substrate 2. More specifically, the semiconductor chip 3 is electrically coupled to the pads 20a of the wiring substrate 2 by the bumps 3a arranged on the circuit formation surface.

The underfill resin 4 fills gaps formed between the wiring substrate 2 and the semiconductor chip 3. The underfill resin 4 increases the coupling strength of portions at which the bumps 3a and pads 20a are coupled, prevents corrosion and electromigration of the wiring pattern 20, and increases the reliability of the wiring pattern 20. The underfill resin 4 may be formed from, for example, an epoxy resin.

A method for manufacturing the semiconductor device will now be described with reference to FIGS. 3 to 6.

Figure 3A:
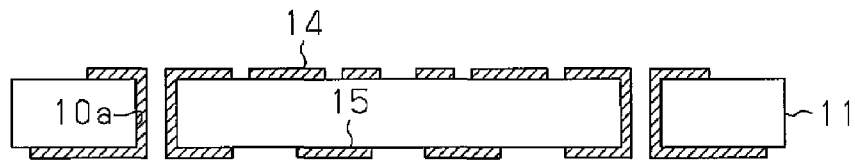
FIGS. 3(a) to 3(d) are schematic cross-sectional views showing procedures for manufacturing the semiconductor device of FIG. 1(a)

First, a method for manufacturing the wiring substrate 2 will be described. In the method for manufacturing the wiring substrate 2 as shown in FIGS. 3 to 5(b), the core substrate 11 shown in FIG. 3(a) is used. The core substrate 11 is formed by, for example, a copper clad laminate (CCL). Through holes 10a are formed in the core substrate 11. The walls of the through holes 10a are plated to electrically couple opposite sides of the core substrate 11. Then, a subtractive process is performed to form the wires 14 and 15.

Figure 3B:
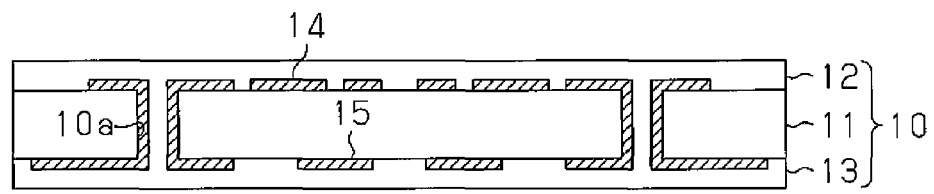
Figure 3C:
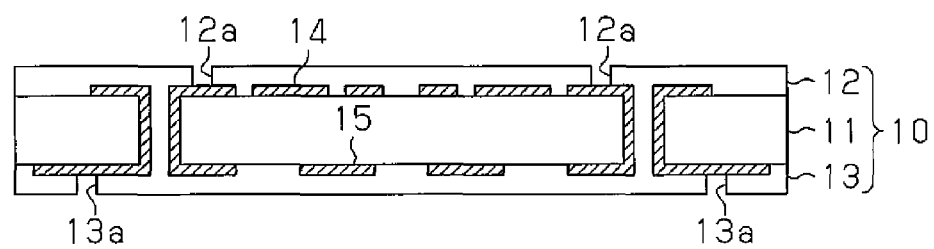

As shown in FIG. 3(b), the insulation layers 12 and 13 are formed on opposite surfaces of the core substrate 11. Then, as shown in FIG. 3(c), openings 12a and 13a are formed at certain locations in the insulation layers 12 and 13 by performing, for example, laser processing. This exposes the surfaces of the wires 14 and 15.

Figure 3D:
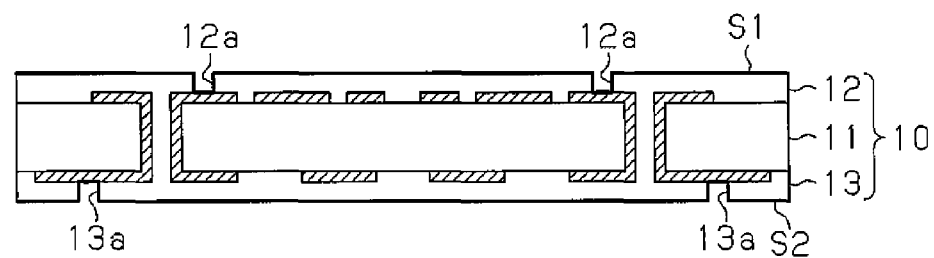

After performing a desmear process, referring to FIG. 3(d), a seed layer S1 is formed to cover the insulation layer 12 and the wires 14. Further, a seed layer S2 is formed to cover the insulation layer 13 and the wires 15. Electroless copper plating or sputtering is performed to form the seed layers S1 and S2.

Figure 4A:
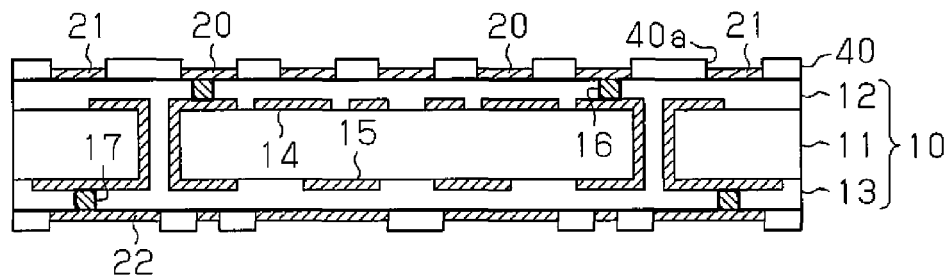
FIGS. 4(a) to 4(d) are schematic cross-sectional views showing procedures for manufacturing the semiconductor device of FIG. 1(a)
Figure 6A:
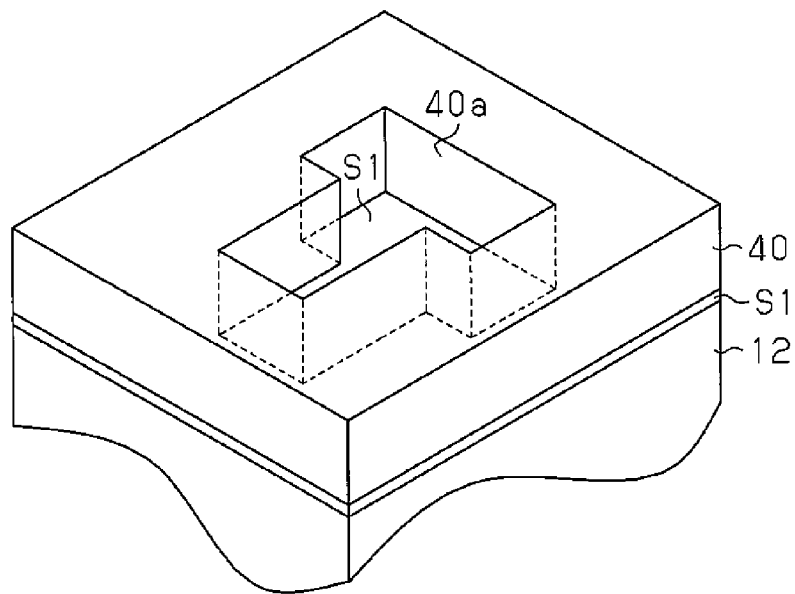
FIGS. 6(a) and 6(b) are schematic perspective views showing procedures for manufacturing the semiconductor device of FIG. 1(a)
Figure 6B:
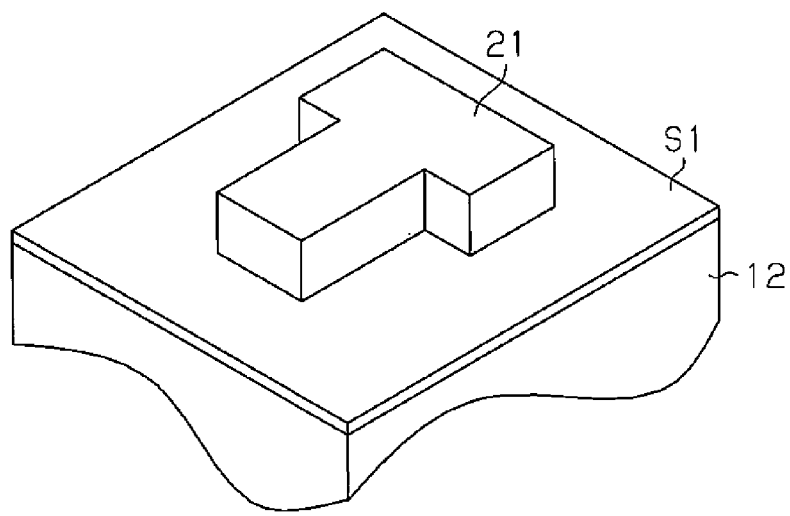

Next, referring to FIG. 4(a), for example, a semi-additive process is performed to form the wiring patterns 20, 21, and 22 and the vias 16 and 17 (wiring layer formation step). More specifically, photolithography is performed to form a dry film resist (DFR) 40, which includes an opening pattern 40a corresponding to the shapes of the wiring patterns 20 and 21, on the seed layer S1. This forms the wiring pattern 20 with portions having the desired shapes (in the present example, circular) and the wiring pattern 21 with portions having the desired shapes (in the present example, triangular and T-shaped). Here, referring to FIG. 6(a), the opening pattern 40a of the DFR 40 that determines the shape of the wiring pattern 21 is formed by performing photolithography. Thus, even when the desired shape of the wiring pattern 21 includes an acute-angled corner, the opening pattern 40a can be accurately formed in correspondence with the desired shape. Accordingly, as shown in FIG. 6(b), the wiring pattern 21 can be accurately formed with the desired shape. The wiring pattern 22 and the vias 17 are formed in the same manner as the wiring patterns 20 and 21 and the vias 16.

Figure 4B:
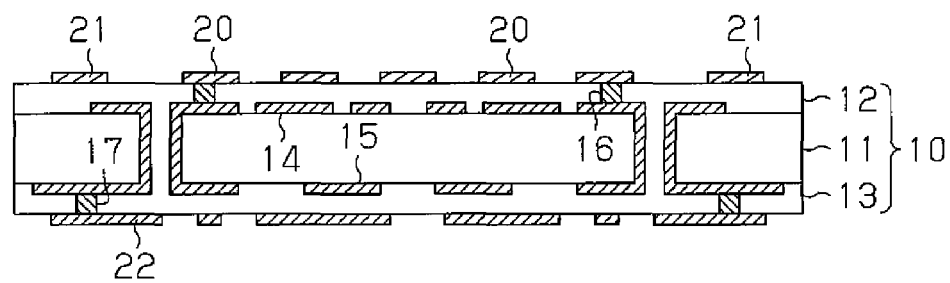

When the wiring patterns 20, 21, and 22 and the vias 16 and 17 are formed in this manner, the DFR 40 and the unnecessary seed layers S1 and S2 are removed as shown in FIG. 4(b).

Figure 4C:
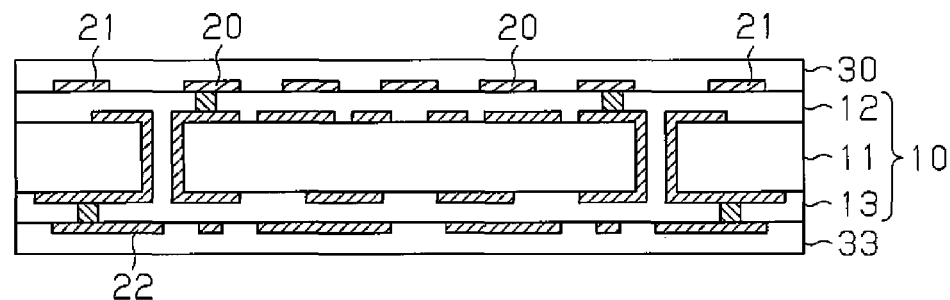

Then, referring to FIG. 4(c), the solder resist layer 30 is formed to cover the wiring patterns 20 and 21 (insulation layer formation step), which are formed on the upper surface of the substrate body 10. Further, the solder resist layer 33 is formed to cover the wiring pattern 22, which is formed on the lower surface of the substrate body. When using a liquid resist, the solder resist layers 30 and 33 may be formed by performing screen printing, spray coating, or roll coating. Further, the upper and lower surfaces of the substrate body 10 may be laminated by a solder resist film to form the solder resist layers 30 and 33. The solder resist layers 30 and 33 may each have a thickness of, for example, 25 μm. When the wiring patterns 20 and 21 are formed from copper, the wiring patterns 20 and 21 may each have a thickness of, for example, 15 μm.

Figure 4D:
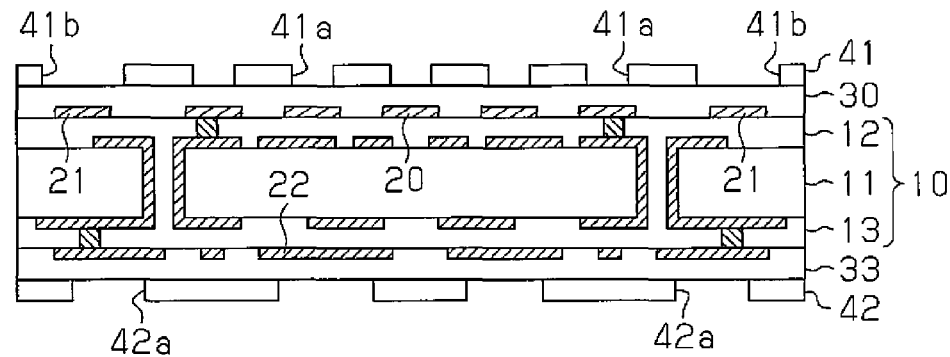

Next, referring to FIG. 4(d), a dry film resist is applied to the solder resist layer 30 and patterned by undergoing exposure and development. This forms openings 41a, which correspond to the openings 30a, and a mask 41, which is used for protection from sandblasting and includes openings 41b corresponding to the recesses 30b. More specifically, the openings 41a are formed at positions facing the pads 20a with the same shapes as the openings 30a (circular when viewed from above). Further, the mask 41 is formed with the openings 41b at positions facing the wiring pattern 21 with the same shapes as the recesses 30b (tetragonal when viewed from above). Each opening 41b is smaller than the corresponding portion of the wiring pattern 21 when viewed from above. The openings 41b are formed in the mask 41 at regions facing the wiring pattern 21 in the solder resist layer 30 and reduce the thickness of the solder resist layer 30 at regions that are larger than the wiring pattern 21 when viewed from above. Further, a dry film resist is applied to the solder resist layer 33 and patterned by undergoing exposure and development. This forms a mask 42, which is used for protection from sandblasting and includes openings 42a corresponding to the openings 33a.

Figure 5A:
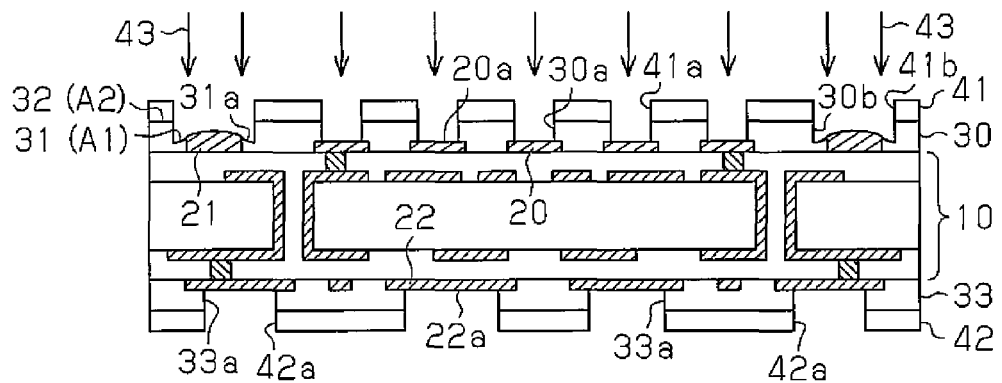
FIGS. 5(a) to 5(d) are schematic cross-sectional views showing procedures for manufacturing the semiconductor device of FIG. 1(a)

Then, referring to FIG. 5(a), the solder resist layer 30 is sandblasted through the openings 41a and 41b (blasting step). Abrasive grains 43 are blasted into the openings 41a and 41b of the mask 41 to reduce the thickness of the solder resist layer 30 (solder resist layer 31) to a predetermined thickness. More specifically, sandblasting is performed on the solder resist layer 30 until portions of the solder resist layer 30 facing the openings 41a of the mask 41 are removed. This forms the openings 30a in the solder resist layer 30 and partially exposes the wiring pattern 20 as the pads 20a from the openings 30a.

Further, the solder resist layer 31 is abraded through the openings 41b of the mask 41 so that the upper surface of the solder resist layer 31, the thickness of which is reduced, is lower than that of the upper surface of the wiring pattern 21 (recognition marks 21a). As the thickness of the solder resist layer 31 decreases and the upper surface of the wiring pattern 21 becomes exposed from the solder resist layer 31, the blasted abrasive grains 43 also reach the wiring pattern 21. Here, since the wiring pattern 21 is formed from metal and is thereby harder than the solder resist layer 31, the wiring pattern 21 is not as easily abraded as the solder resist layer 31. This results in the formation of the curved portion 31a, which is curved in a concaved manner from the edges of the wiring pattern 21 to the boundary between the solder resist layers 31 and 32. Such a thickness reduction process (refer to FIGS. 4(d) and 5(a)) forms the recesses 30b in the solder resist layer 31 and entirely exposes the upper surface of the wiring pattern 21 as the recognition marks 21a. Further, the solder resist layer 31, the thickness of which has been reduced, is formed on the side wall (surrounding) of the wiring pattern 21. The surface roughness of the upper surface of the solder resist layer 31 (surface roughness of the bottom surface A1 of each recess 30b) becomes greater than the surface roughness of the upper surface of the solder resist layer 32 (surface roughness of the surrounding portion A2 of each recess 30b). For example, the surface roughness of the solder resist layer 32 before the thickness is reduced is approximately 50 nm, whereas the surface roughness of the solder resist layer 32 after the thickness is reduced is approximately 400 nm.

In the same manner, sandblasting is performed through the openings 42a of the mask 42 on the solder resist layer 33 formed on the lower surface of the substrate body 10. More specifically, sandblasting is performed on the solder resist layer 33 until portions of the solder resist layer 33 facing the openings 42a of the mask 42 are removed. This forms the openings 33a in the solder resist layer 33 and partially exposes the wiring pattern 22 as the external coupling pads 22a from the openings 33a.

Figure 5B:
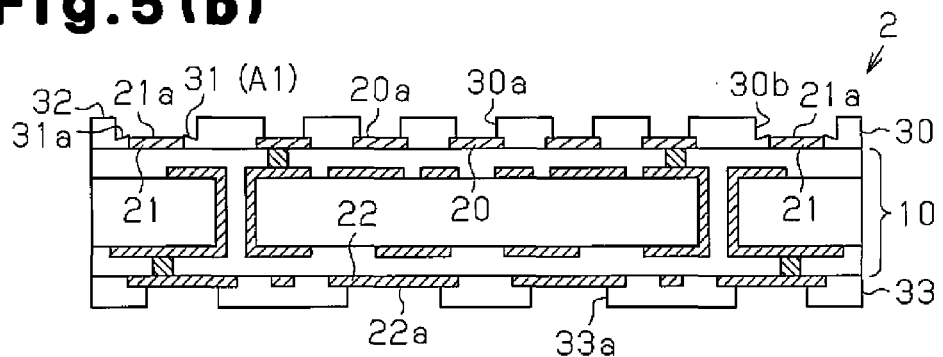

Then, referring to FIG. 5(b), the masks 41 and 42 are removed, and soft etching (e.g., Cu soft etching) is performed to clean the surfaces of the pads 20a and 22a and the wiring pattern 21 (etching step). Here, the wiring pattern 21 is etched until the upper surface of the wiring pattern 21 becomes lower than the bottom surface A1 of each recess 30b (upper surface of the solder resist layer 31 contacting the side wall of the wiring pattern 21). This forms the recognition marks 21a, which are exposed from the solder resist layer 31. After this surface processing is performed, the surface roughness of the upper surface of each recognition mark 21a is, for example, 300 nm and less than the surface roughness of the upper surface of the solder resist layer 31. The manufacturing steps described above manufacture the wiring substrate 2 of the present embodiment.

Figure 5C:
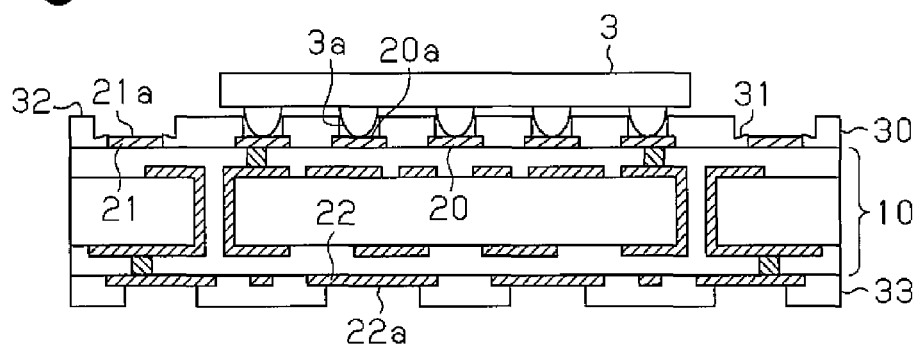
Figure 5D:
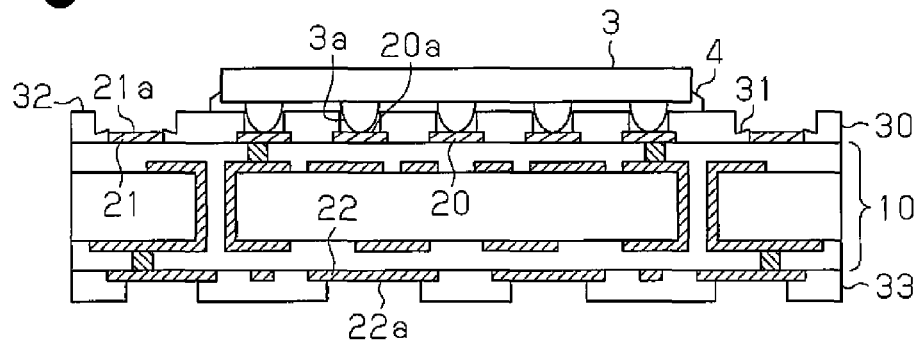

A method for mounting the semiconductor chip 3 on the wiring substrate 2 manufactured as described above will now be described. Referring to FIG. 5(c), the bumps 3a of the semiconductor chip 3 is flip-chip-bonded to the pads 20a of the wiring substrate 2. Then, referring to FIG. 5(d), the underfill resin 4 is filled and hardened between the flip-chip-bonded semiconductor chip 3 and wiring substrate 2. These manufacturing steps manufacture the semiconductor device of the present embodiment.

The present embodiment has the advantages described below.

x(1) The upper surface of the wiring pattern 21 is entirely exposed from the solder resist layer 30 to form the recognition marks 21a, and the solder resist layer 30 includes the recesses 30b to entirely expose the upper surface of the wiring pattern 21. This results in the shape (as viewed from above) of the upper surface of the wiring pattern 21 exposed from the solder resist layer 30 setting the shape of each recognition mark 21a. Even when the desired shape of the recognition mark 21a includes a right-angled or acute-angled corner, the wiring pattern 21 can easily be formed with the desired shape through photolithography or the like. Accordingly, as long as the upper surface of the wiring pattern 21 is entirely exposed, the recognition marks 21a can be formed with the desired shape even when the recesses 30b cannot be formed with the desired shape (tetragonal shape) through a blasting process, that is, even when the four corners of each recess 30b is rounded. As a result, the discernibility of the recognition mark is improved.

Further, the recesses 30b, which expose the recognition marks 21a, are formed by performing a blasting process. Thus, a non-photosensitive resin (thermosetting resin or the like) can be used to form the solder resist layer 30. This increases the reliability of the solder resist layer 30 in relation with heat resistance and chemical resistance in comparison to when using a photosensitive resin to form the solder resist layer 30.

x(2) The surface roughness of the bottom surface A1 of each recess 30b (upper surface of the solder resist layer 31) is greater than that of the upper surface of each recognition mark 21a. Thus, for example, when detecting the recognition marks 21a with the intensity of the light reflected by the surface of the recognition marks 21a or the like, the difference between the reflection light intensity of the recognition mark 21a and the reflection light intensity of the solder resist layer 31 is increased. This emphasizes the boundary between the recognition mark 21a and the solder resist layer 31, that is, the profile of the recognition mark 21a, and improves the discernibility of the recognition mark 21a.

x(3) The bottom surface A1 of each recess 30b (upper surface of the solder resist layer 31) includes the curved portion 31a, which is curved in a concaved manner from the edge of the corresponding recognition mark 21a to the side walls A3 of the recess 30b. Thus, for example, when detecting the recognition marks 21a with the intensity of the light reflected by the surface of the recognition marks 21a or the like, the difference between the reflection light intensity of the recognition mark 21a and the reflection light intensity of the solder resist layer 31 is increased. This emphasizes the boundary between the recognition mark 21a and the solder resist layer 31, that is, the profile of the recognition mark 21a, and improves the discernibility of the recognition mark 21a.

x(4) The recognition marks 21a are formed so that the upper surfaces of the recognition marks 21a are lower than the bottom surfaces A1 of the recesses 30b. For example, when forming the recesses 30b in the solder resist layer 30, referring to FIG. 5(a), damages resulting from the sandblasting may deform the upper surface of the wiring pattern 21 such that the shape of the wiring pattern 21 when viewed from above becomes larger than the desired shape. When such a wiring pattern 21 is set as the recognition mark 21a, the discernibility of the recognition mark is decreased. In contrast, when the upper surface of the recognition marks 21a is lower than the bottom surface A1 of the recess 30b, even when a processing damage deforms the wiring pattern 21, the wiring pattern 21 can be returned to the desired shape as shown in FIG. 5(b). Accordingly, the discernibility of the recognition marks 21a is prevented from being decreased.

x(5) The wiring pattern 20, which forms the pads 20a, has the same thickness as the wiring pattern 21, which forms the recognition marks 21a. Thus, the wiring patterns 20 and 21 can be simultaneously formed in the same process (refer to FIG. 4(a)). Further, the pads 20a and the recognition marks 21a can be formed in the same process (refer to FIGS. 5(a) and 5(b)).

Second Embodiment

A second embodiment of a semiconductor device 5 will now be described with reference to FIGS. 7 and 8. Like or same reference numerals are given to those components that are the same as the corresponding components of FIGS. 1 to 6. Such components will now be described in detail.

In the first embodiment, the wiring substrate 2 includes the pads 20a, which are arranged in a matrix. In the second embodiment, pads are arranged in a peripheral portion of a wiring substrate.

Figure 7:
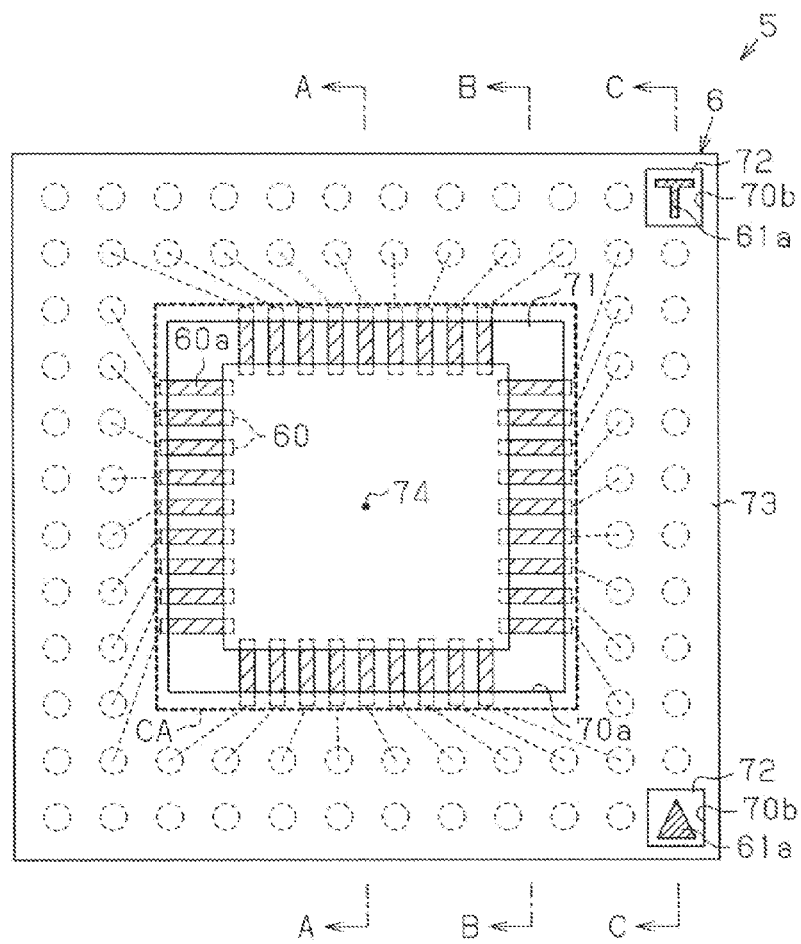
FIG. 7 is a schematic plan view showing a second embodiment of a semiconductor device.
Figure 8A:
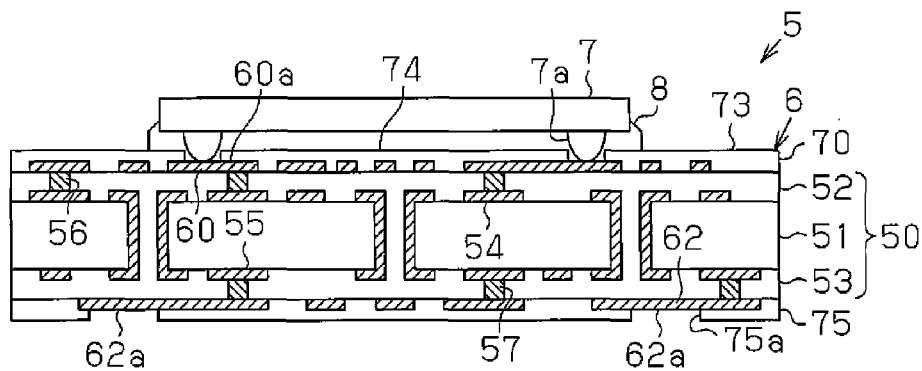
FIGS. 8(a) to 8(c) are schematic cross-sectional views showing the semiconductor device of FIG. 7.
Figure 8B:
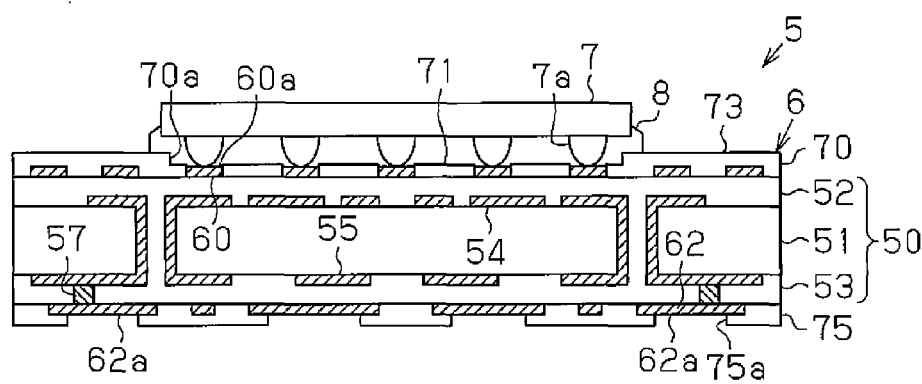
Figure 8C:
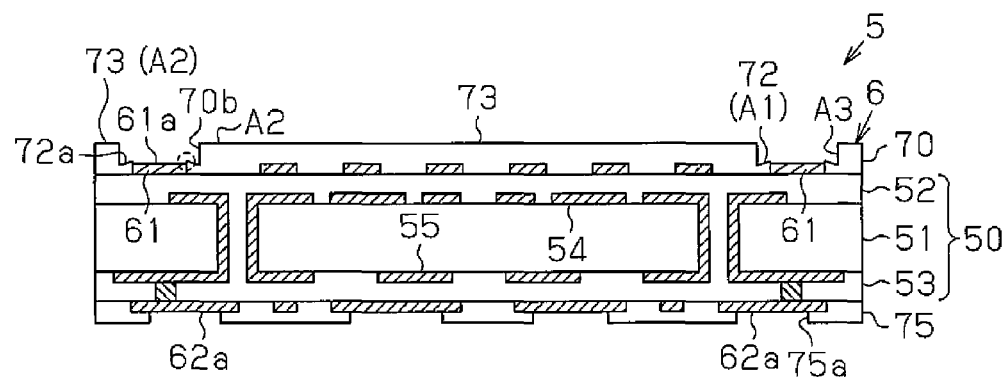

FIG. 7 is a schematic plan view showing the semiconductor device 5. FIG. 8(a) is a schematic cross-sectional view showing the semiconductor device 5 taken along line A-A in FIG. 7. FIG. 8(b) is a schematic cross-sectional view showing the semiconductor device 5 taken along line B-B in FIG. 7. FIG. 8(c) is a schematic cross-sectional view showing the semiconductor device 5 taken along line C-C in FIG. 7.

As shown in FIGS. 7 and 8(a) to 8(c), the semiconductor device 5 includes a wiring substrate 6, a semiconductor chip 7, and an underfill resin 8.

As shown in FIGS. 8(a) to 8(c), the wiring substrate 6 includes a substrate body 50, uppermost layer wiring patterns 60 and 61 (uppermost layer wiring), a lowermost wiring pattern 62, and solder resist layers 70 and 75. A plurality of bumps 7a are arranged in a peripheral portion (around the chip) of a circuit formation surface (lower surface as viewed in FIG. 8) of the semiconductor chip 7 mounted on the wiring substrate 6.

The substrate body 50 includes a core substrate, insulation layers 52 and 53, and wires 54 and 55 and vias 56 and 57 formed in the insulation layers 52 and 53. The wires 54 and 55 and the vias 56 and 57 arranged in the substrate body 50 are electrically connected to the wiring patterns 60 and 62. The wires 54 and 55 and the vias 56 and 57 may be formed from, for example, copper (Cu). Further, the insulation layers 52 and 53 may be formed from an insulation resin of, for example, epoxy resin or polyimide resin.

The wiring pattern 60 is arranged on the chip mounting side (upper side as viewed in FIG. 8(a)) of the substrate body 50. The wiring pattern 60 includes pads 60a, which are coupled to the bumps 7a of the semiconductor chip 7. The wiring pattern 60 is, for example, tetragonal when viewed from above (refer to FIG. 7).

The wiring pattern 61 is arranged on the chip mounting surface of the substrate body 50. The upper surface of the wiring pattern 61 is entirely exposed from the solder resist layer 70 to form recognition marks 61a. Further, the wiring pattern 61 (recognition marks 61a) when viewed from above is, for example, triangular or T-shaped as shown in FIG. 7. The wiring pattern 61 has the same thickness as the wiring pattern 60. The wiring patterns 60 and 61 may be formed from, for example, copper. The wiring patterns 60 and 61 may be formed by applying a plating (e.g., nickel plating or gold plating) to the surface of a copper layer.

As shown in FIG. 8, the wiring pattern 62 is arranged on the substrate body 50 on the opposite side (lower side as viewed in FIG. 1(b)) of the chip mounting surface. The wiring pattern 62 includes external coupling pads 62a, which are used by external coupling terminals coupled to a mounted substrate such as a mother board. The wiring pattern 62 may be formed from, for example, copper.

The solder resist layer 70 is arranged on a chip mounting surface of the substrate body 50 to cover the wiring patterns 60 and 61. The solder resist layer 70 may be formed from, for example, an epoxy insulation resin. The solder resist layer 70 includes a recess 70a, which partially exposes the wiring pattern 60 to form the pads 60a, and recesses 70b, which entirely expose the upper surface of the wiring pattern 61. The solder resist layer 70 includes a solder resist layer 71, which is formed in a regions corresponding to the recess 70a, solder resist layers 72, which are formed in regions corresponding to the recesses 70a, a solder resist layer 73, which is formed in a region outside the region corresponding to the recesses 70a, and a solder resist layer 74, which is formed in a region outside the recess 70a. In other words, the solder resist layers 72 form bottom surfaces A1 of the recesses 70b, and the solder resist layer 73 forms a surrounding portion A2 of the recesses 70b. The solder resist layers 71, 72, 73, and 74 are formed integrally.

The shape of the recess 70a will now be described. In the present embodiment, the bumps 7a are arranged in the peripheral portion of the semiconductor chip 7. Thus, the pads 60a formed on the wiring substrate 6 are arranged in accordance with the layout of the bumps 7a (refer to FIG. 7). Accordingly, a frame-shaped pad formation region is formed in a chip mounting region CA. The recess 70a is formed by performing sandblasting in the same manner as the openings 30a of the first embodiment so that the thickness at the portion of the solder resist layer 71 corresponding to the recess 70a becomes less than the thickness at the solder resist layers 73 and 74 of the other portions.

In the recess 70a, parts of the wiring pattern 60 are exposed as the pads 60a (refer to FIG. 8(a)), and the solder resist layer 71 is formed in parts other than the pads 60a (refer to FIG. 8(b)). Thus, as shown in FIG. 8(b), the solder resist layer 71 is formed between adjacent pads 60a. Additionally, as shown in FIG. 8(b), the upper surface of the solder resist layer 71 is located at a level that is higher than that of the upper surface of the pads 60a. In contrast, the upper surface of the solder resist layer 71 is located at a level that is lower than that of the upper surfaces of the solder resist layers 73 and 74.

The shape of each recess 70b will now be described. In the present embodiment, the wiring pattern 61 under the solder resist layer 70 forms each recognition mark 61a with a desired shape. When it is desirable that the recognition mark 61a be T-shaped, the corresponding part of the wiring pattern 61 is formed to be T-shaped. When it is desirable that the recognition mark 61a be triangular, the corresponding part of the wiring pattern 61 is formed to be triangular. Further, as shown in FIG. 7, the recesses 70b are larger than the wiring pattern 61 when viewed from above to entirely expose the upper surface of the wiring pattern 61. In the same manner as the recess 70a, the recesses 70b are formed by performing sandblasting in the same manner as the recess 70a so that the thickness at the portion of the solder resist layer 72 corresponding to the recesses 70b becomes less than the thickness at the solder resist layer 73 of the other portions.

In each recess 70b, the upper surface of the wiring pattern 61 is exposed as the recognition mark 61a, and the solder resist layer 72 is formed outside the recognition mark 61a. Thus, the shape of the wiring pattern 61 determines the shape of the recognition mark 61a. Further, the solder resist layer 72 (solder resist layer 70) is formed in contact with side walls of the wiring pattern 61. In other words, the recognition mark 61a is surrounded by the solder resist layer 72 (solder resist layer 70). The solder resist layer 72 (bottom surface A1 of the recess 70b) includes a curved portion 72a, which is curved in a concaved manner from the edge of the recognition mark 61a to a side wall A3 of the recess 70b.

The relationship between the recess 70b and the recognition mark 61a will now be described in further detail. The bottom surface A1 of the recess 70b (upper surface of the solder resist layer 72) is located at a level that is higher than that of the recognition mark 61a and lower than that of the surrounding portion A2 of the recess 70b (upper surface of the solder resist layer 73). Further, the bottom surface A1 of the recess 70b (upper surface of the solder resist layer 72) has a surface roughness that is greater than that of the upper surface of the recognition mark 61a and greater than that of the surrounding portion A2 of the recess 70b (upper surface of the solder resist layer 73).

Referring to FIG. 8, each external coupling pad 62a is exposed from the solder resist layer 75 formed on the substrate body 50 on the opposite side of the chip mounting surface (lower surface as viewed in FIG. 8). The external coupling pads 62a are used by external coupling terminals coupled to a mounted substrate such as a mother board.

As shown in FIGS. 8(a) and 8(b), the semiconductor chip 7 is flip-chip-bonded to the wiring substrate 6. More specifically, the semiconductor chip 7 is electrically coupled to the pads 60a of the wiring substrate 6 by the bumps 7a arranged on the circuit formation surface.

The underfill resin 8 fills gaps formed between the wiring substrate 6 and the semiconductor chip 7. The underfill resin 8 may be formed from, for example, an epoxy resin.

The second embodiment has the same advantages as the first embodiment.

It should be apparent to those skilled in the art that the present invention may be embodied in many other specific forms without departing from the spirit or scope of the invention. Particularly, it should be understood that the present invention may be embodied in the following forms.

Figure 9:
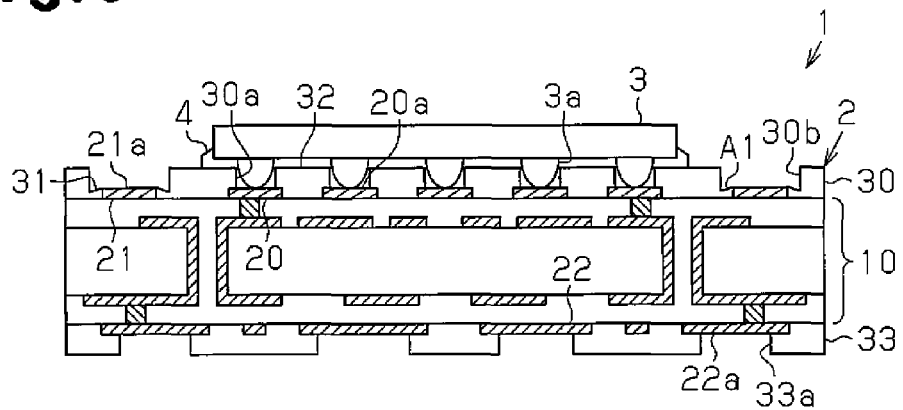
FIG. 9 is a schematic cross-sectional view showing a modified example of a semiconductor device.

In the embodiments described above, the upper surfaces of the recognition marks 21a and 61a are located at a level that is lower than the bottom surfaces A1 of the recesses 30b and 70b. However, the present invention is not limited in such a manner. For example, as shown in FIG. 9, the upper surface of each recognition marks 21a may be located at the same level as the bottom surface A1 of each recess 30b.

Figure 10:
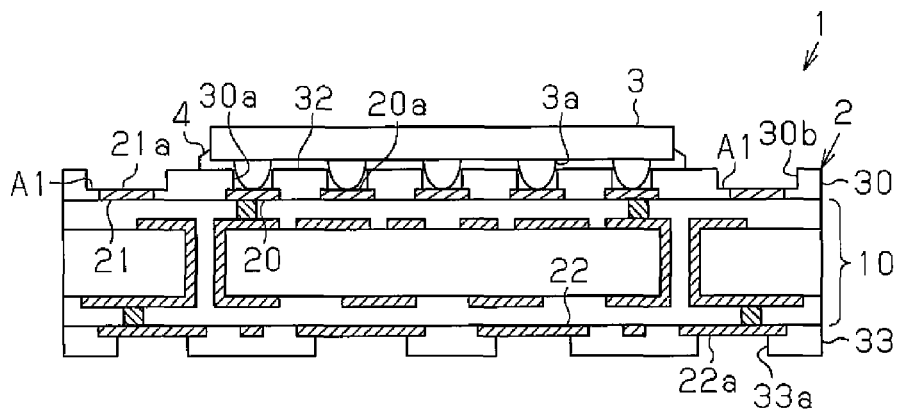
FIG. 10 is a schematic cross-sectional view showing a modified example of a semiconductor device.

In the embodiments described above, the curved portion 31a is formed in the bottom surface A1 of each recess 30b, and the curved portion 72a is formed in the bottom surface A1 of each recess 70b. However, the present invention is not limited in such a manner. For example, as shown in FIG. 10, the curved portion 31a may be eliminated from the bottom surface A1 of each recess 30b.

Figure 11:
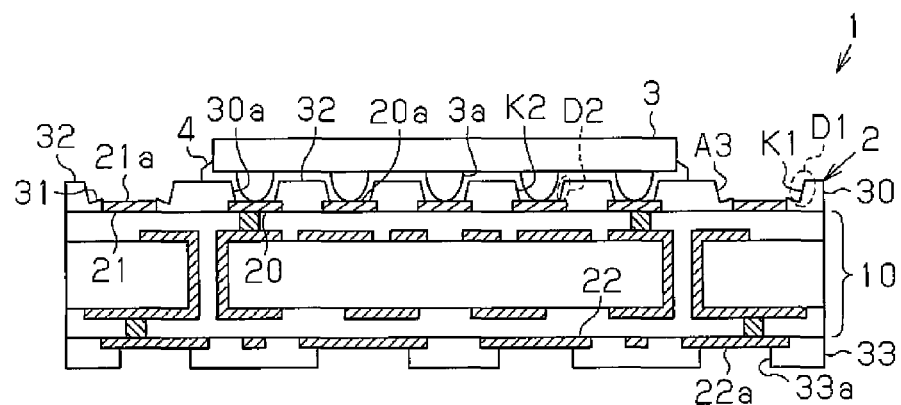
FIG. 11 is a schematic cross-sectional view showing a modified example of a semiconductor device.
Figure 12A:
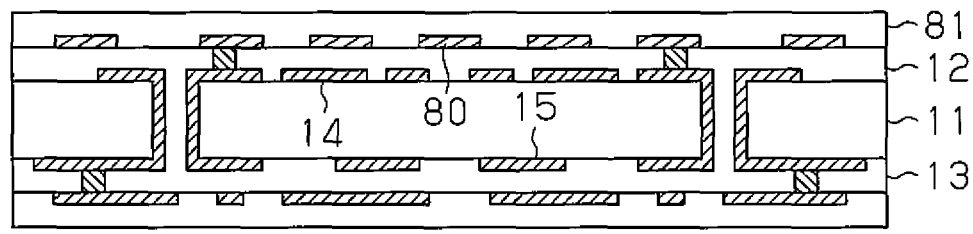
FIGS. 12(a) and 12(b) are schematic cross-sectional views showing procedures for manufacturing a conventional semiconductor device.
Figure 12B:
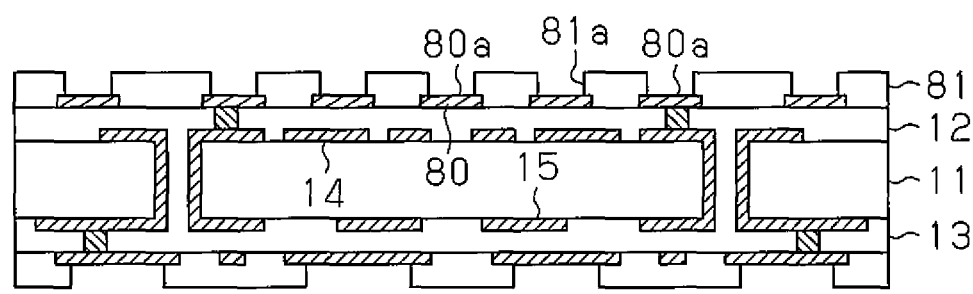
Figure 13A:
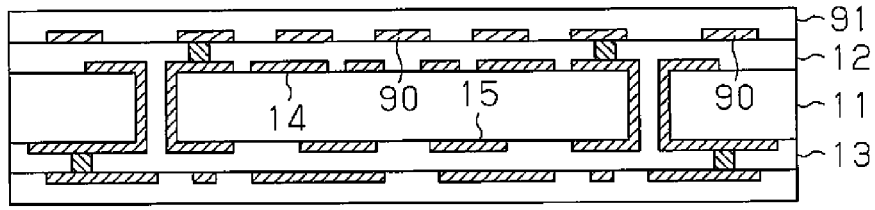
FIGS. 13(a) to 13(d) are schematic cross-sectional views showing procedures for manufacturing a conventional semiconductor device.
Figure 13B:
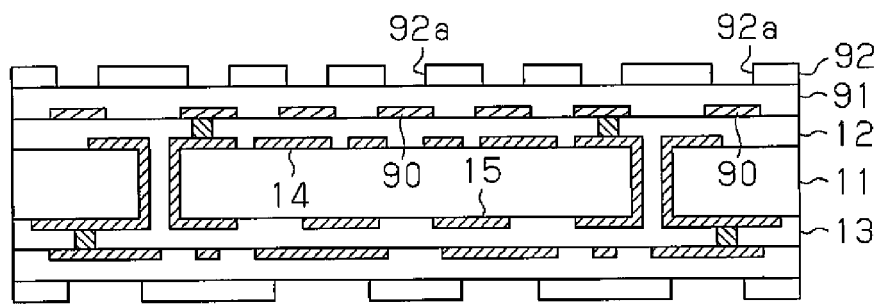
Figure 13C:
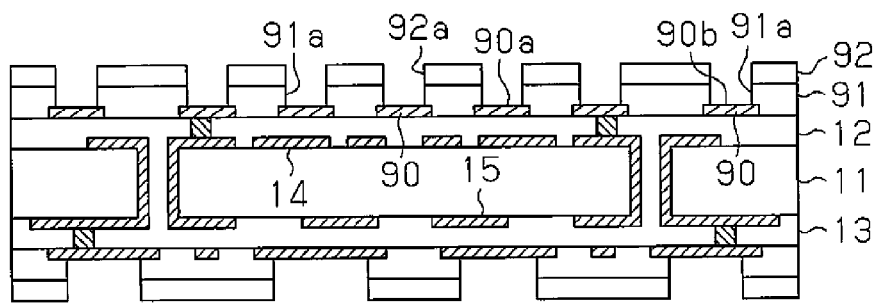
Figure 13D:
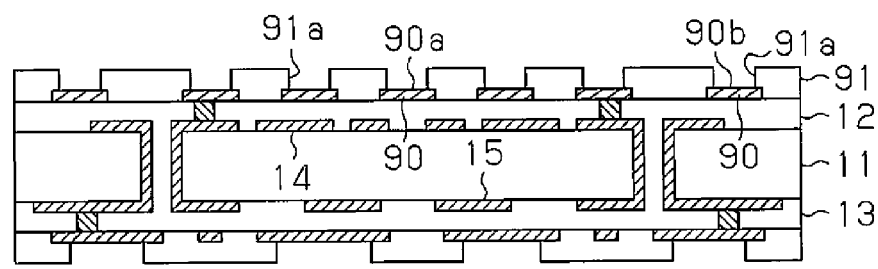
Figure 14:
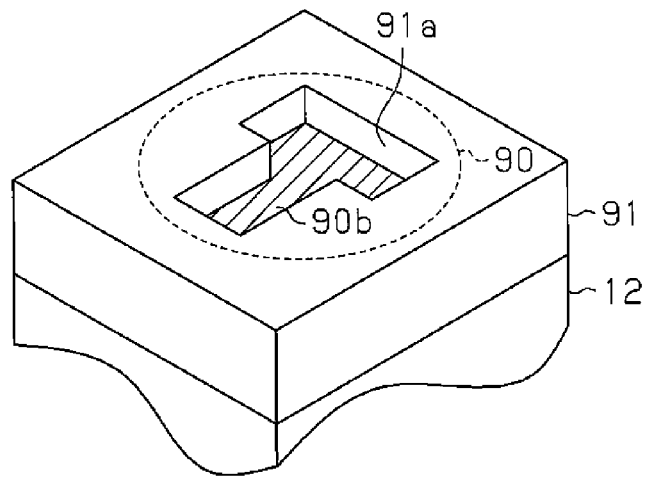
FIG. 14 is a schematic perspective view showing a conventional wiring substrate.
Figure 15A:
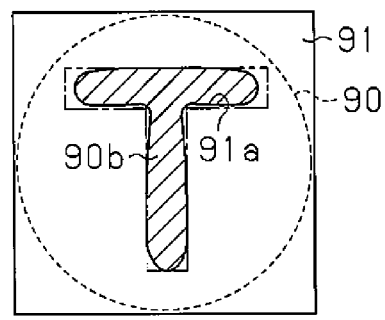
FIGS. 15(a) and 15(b) are schematic plan views showing a conventional wiring substrate.
Figure 15B:
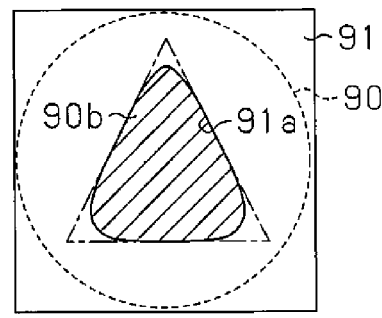

As shown in FIG. 11, a step D1 formed by the solder resist layers 31 and 32 in the first embodiment may include a sloped portion K1. That is, the side wall A3 of the recess 30b may be a sloped surface. Further, the step D1 may be formed so that the sloped portion K includes a curved surface. A step D2 formed by each pad 20a and the solder resist layer 32 may also include a sloped portion K2. The same applies to the second embodiment.

In the embodiments described above, the shapes of the recesses 30b and 70b used to form the recognition marks 21a and 61a are not particularly limited as long as the upper surfaces of the wiring patterns 21 and 61 can be entirely exposed. For example, the recesses 30b and 70b may be circular when viewed from above.

In the embodiments described above, sandblasting is performed to reduce the thickness or remove the solder resist layers 30 and 70. However, the present invention is not limited in such a manner. For example, the thickness of the solder resist layers 30 and 70 may be reduced by performing a blasting process other than sandblasting such as wet blasting. Further, the thickness of the solder resist layers 30 and 70 may be reduced by performing, for example, resin etching or laser processing.

In the embodiments described above, the shapes of the openings 30a and the recess 70a, which are used to form the pads 20a and 60a, are not particularly limited. For example, the openings 30a and the recess 70a may be formed to entirely expose the wiring patterns 20 and 60 as the pads 20a and 60a.

In the first embodiment, the dry film resist applied to the solder resist layer 30 is exposed, developed, and patterned to form the mask 41, which is used for protection from sandblasting and includes the openings 41a and 41b. However, the present invention is not limited in such a manner. For example, a metal mask may be used as the mask 41. Further, a metal foil may be patterned in the same manner as the dry film resist to form the mask 41.

In the embodiments described above, the semiconductor chips 3 and 7 are respectively mounted on the wiring substrates 2 and 6. However, the mounted bodies are not limited to the semiconductor chips 3 and 7. For example, the present invention may be applied to a flip-chip-mounting type package (package-on-package) that stacks a further wiring substrate on the wiring substrates 2 and 6.

In the embodiments described above, the structures of the layers under the wiring patterns 20 and 60 are not limited. For example, the structure and materials of the core substrates 11 and 51 are not particularly limited. Further, the number of lower layer wires (e.g., the wires 14 and 15 in the first embodiment) formed on the core substrates 11 and 51 and the number of insulation layers (e.g., the insulation layers 12 and 13 in the first embodiment) are not particularly limited. That is, a certain number of lower layer wires and insulation wires covering the wires may be formed on the core substrates 11 and 51. Further, the shapes of the wiring patterns 20 and 60 are not particularly limited.

In the embodiments described above, the elements formed on the wiring patterns 20 and 21 (wiring patterns 60 and 61) are not limited to the solder resist layers 30 and 70 and may be insulation layers.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A wiring substrate comprising:
a substrate body;
an uppermost layer wiring formed on the substrate body and including a first wiring layer part, wherein the first wiring layer part is independently formed on the substrate body and includes an upper surface and a side wall, the upper surface forming a recognition mark; and
an insulation layer formed on the substrate body and the uppermost layer wiring, wherein the insulation layer includes a recess which entirely exposes the upper surface of the first wiring layer part, wherein the insulation layer further includes a lower side wall and an upper side wall, the lower side wall being adjacent to the side wall of the first wiring layer part and surrounding the side wall of the first wiring layer part, and the upper side wall forming a part of the recess, and wherein the recess includes a bottom surface that is larger than the upper surface of the first wiring layer part, wherein the bottom surface of the recess includes a curved portion curved in a concaved manner from an edge of the recognition mark to the upper side wall of the insulation layer.

2. The wiring substrate according to claim 1, wherein
the insulation layer includes a surrounding portion that surrounds the bottom surface, and
the bottom surface of the recess has a surface roughness that is greater than that of the upper surface of the first wiring layer part and greater than that of the surrounding portion of the recess.

3. The wiring substrate according to claim 1, wherein the upper surface of the first wiring layer part is located at a level that is lower than that of the bottom surface of the recess.

4. The wiring substrate according to claim 1, wherein the upper surface of the first wiring layer part is located at a level that is the same as that of the bottom surface of the recess.

5. The wiring substrate according to claim 1, wherein the uppermost layer wiring includes a second wiring layer part having a thickness that is the same as that of the first wiring layer part, wherein the second wiring layer part is at least partially exposed from the first insulation layer to form a pad.

6. The wiring substrate according to claim 1, wherein the upper side wall of the insulation layer includes an inclined surface.

7. A semiconductor device comprising the wiring substrate according to claim 1.

8. A method for manufacturing a wiring substrate the method comprising:
preparing a substrate body;
forming uppermost layer wiring, which includes a first wiring layer part including an upper surface that forms a recognition mark, on the substrate body;
forming an insulation layer on the substrate body and the first wiring layer part; and
forming a recess that entirely exposes the upper surface of the first wiring layer part, which forms the recognition mark, from the insulation layer by partially reducing thickness of the insulation layer at a region that corresponds to and is larger than the upper surface of the first wiring layer part, wherein the forming the recess includes forming a bottom surface of the recess, the bottom surface including a curved portion curved in a concaved manner from an edge of the recognition mark to an upper side wall of the insulation layer.

9. The method according to claim 8, further comprising etching the upper surface of the first wiring layer part.

10. The method according to claim 9, wherein the etching the upper surface of the first wiring layer part includes soft-etching the first wiring layer part so that the upper surface of the first wiring layer part is located at a level that is lower than that of the bottom surface of the recess.

11. The method according to claim 9, wherein the etching the upper surface of the first wiring layer part includes soft-etching the first wiring layer part so that the upper surface of the first wiring layer part is located at a level that is the same as that of the bottom surface of the recess.

12. The method according to claim 8, wherein the forming a recess includes:
forming a mask, which includes an opening located at a region corresponding to the recess, on the insulation layer; and
sandblasting the insulation layer through the opening of the mask.

13. The method according to claim 8, wherein
the forming uppermost wiring layer includes forming a second wiring layer part having a thickness that is the same as the first wiring layer part,
the forming an insulation layer includes forming the insulation layer to cover the first wiring layer part and the second wiring layer part, and the forming a recess includes forming the recess and reducing the thickness of the insulation layer at a region facing the second wiring layer part to expose at least part of the second wiring layer part from the insulation layer to form a pad.

* * * * *